(12) United States Patent
Hasanuzzaman et al.

(10) Patent No.: US 9,196,712 B1
(45) Date of Patent: Nov. 24, 2015

(54) FINFET EXTENSION REGIONS

(71) Applicant: International Business Machines Corporation, Armonk, NY (US)

(72) Inventors: Mohammad Hasanuzzaman, Beacon, NY (US); Jeffrey B. Johnson, Essex Junction, VT (US); Kam-Leung Lee, Putnam Valley, NY (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/484,469

(22) Filed: Sep. 12, 2014

(51) Int. Cl.
| | | |
|---|---|---|
| *H01L 29/78* | (2006.01) |
| *H01L 29/66* | (2006.01) |
| *H01L 29/423* | (2006.01) |
| *H01L 29/417* | (2006.01) |
| *H01L 21/311* | (2006.01) |
| *H01L 29/06* | (2006.01) |
| *H01L 21/324* | (2006.01) |
| *H01L 21/283* | (2006.01) |
| *H01L 29/10* | (2006.01) |
| *H01L 21/84* | (2006.01) |

(52) U.S. Cl.
CPC .......... *H01L 29/6681* (2013.01); *H01L 21/283* (2013.01); *H01L 21/31111* (2013.01); *H01L 21/324* (2013.01); *H01L 21/845* (2013.01); *H01L 29/0692* (2013.01); *H01L 29/1079* (2013.01); *H01L 29/41791* (2013.01); *H01L 29/4232* (2013.01); *H01L 29/785* (2013.01); *H01L 29/7833* (2013.01)

(58) Field of Classification Search
CPC ................... H01L 21/02365; H01L 21/02518
See application file for complete search history.

(56) References Cited

U.S. PATENT DOCUMENTS

| | | |
|---|---|---|
| 6,180,978 B1 | 1/2001 | Chatterjee et al. |
| 6,376,293 B1 | 4/2002 | Chapman |
| 7,064,396 B2 | 6/2006 | Chen et al. |
| 7,456,068 B2 | 11/2008 | Kavalieros et al. |
| 7,485,536 B2 | 2/2009 | Jin et al. |
| 7,510,923 B2 | 3/2009 | Mehrotra et al. |
| 7,682,916 B2 | 3/2010 | Murthy et al. |
| 8,435,845 B2 | 5/2013 | Ning et al. |
| 8,598,025 B2 | 12/2013 | Steen et al. |
| 2013/0034938 A1 | 2/2013 | Cheng et al. |

OTHER PUBLICATIONS

J.O. Borland, "Low temperature shallow junction formation for 70nm technology node and beyond," MRS Proceedings, vol. 717, No. 1. 2002.

*Primary Examiner* — Cheung Lee
(74) *Attorney, Agent, or Firm* — Matthew C. Zehrer

(57) ABSTRACT

A semiconductor device fabrication process includes forming a fin upon a semiconductor substrate and forming a gate upon the semiconductor substrate and upon and orthogonal to the fin, forming a source drain contacts by growing epitaxy material over the fin, forming a trench between the epitaxy material and a gate to expose an upper surface portion of the fin, doping the exposed fin portion to form an extension region, and activating the extension region. The semiconductor device may include the fin, gate, gate spacers upon sidewalls of the gate, a source drain contact adjacent to the gate spacers surrounding the fin, and doped extension regions within the fin below the gate spacers.

11 Claims, 4 Drawing Sheets

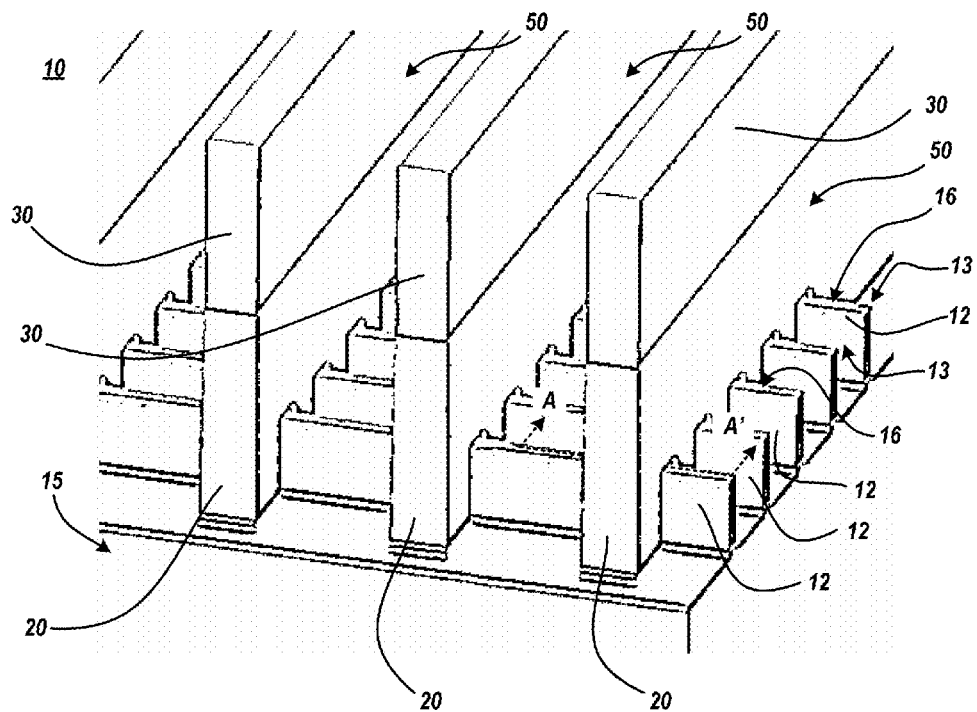
FIG. 1
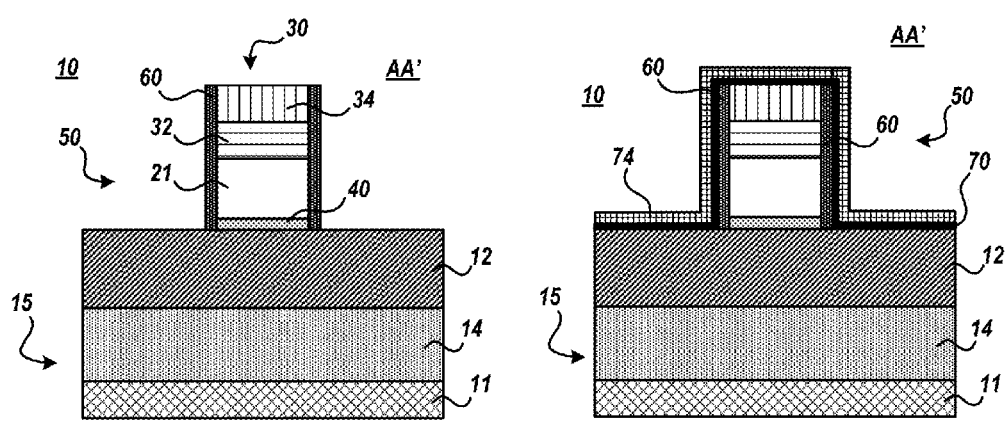
FIG. 2
FIG. 3

FINFET EXTENSION REGIONS

FIELD

Embodiments of invention generally relate to semiconductor devices and semiconductor device fabrication methods. More particularly, embodiments relate to semiconductor structures with one or more extension regions.

BACKGROUND

Transistors are semiconductor devices that are commonly found in a wide variety of integrated circuits. When a voltage is applied to a gate of the transistor that is greater than a threshold voltage, the transistor is turned on, and current may flow through the transistor. When the voltage at the gate is less than the threshold voltage, the transistor is off, and current does not flow through the transistor.

One type of transistor is a multiple-gate field-effect transistor (MuGFET), which is a FET that has more than one gate in a single transistor device. Furthermore, one type of MuG-FET is a FinFET. A FinFET is a nonplanar, multiple-gate transistor formed upon or within a semiconductor substrate.

SUMMARY

In an embodiment of the present invention, a semiconductor device fabrication process includes forming a plurality of fins upon a semiconductor substrate, forming a plurality of gates upon the semiconductor substrate and upon and orthogonal to the plurality of fins, forming a plurality of source drain contacts by growing epitaxy material over the fins, forming a trench between the epitaxially formed material and a gate to expose an upper surface of a fin region, doping the fin region to form an extension region, and activating the extension region by annealing.

In another embodiment of the present invention, a semiconductor device includes a fin upon a semiconductor substrate, a gate upon the semiconductor substrate orthogonal to the fin, gate spacers upon sidewalls of the gate, a source drain contact upon the semiconductor substrate, adjacent to the gate spacers, and surrounding the fin, and doped extension regions within the fin below the gate spacers.

In yet another embodiment of the present invention, a semiconductor device fabrication process includes forming a fin upon a semiconductor substrate, forming a gate stack upon a semiconductor substrate and upon and orthogonal to the fin, forming a gate spacer upon sidewalls of the gate stack, forming a sacrificial spacer upon the gate spacer by depositing a liner layer and a spacer layer, removing portions of the liner layer and spacer layer, and retaining portions of the liner layer and portions of the spacer layer generally upon sidewalls of the gate spacer, forming epitaxially grown material upon sidewalls of the fin, forming a trench between the epitaxially grown material and the gate spacer to expose an upper surface of the fin by removing the sacrificial spacer, forming extension regions by implanting ions within a fin region assessable by the trench, and forming replacement spacers upon sidewalls of the gate spacer and within the trench.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 1 depicts an isometric view of a semiconductor structure at intermediate stages of semiconductor device fabrication, in accordance with various embodiments of the present invention.

FIG. 2-FIG. 10 depict cross section views of a semiconductor structure at intermediate stages of semiconductor device fabrication, in accordance with various embodiments of the present invention.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Figure 4:
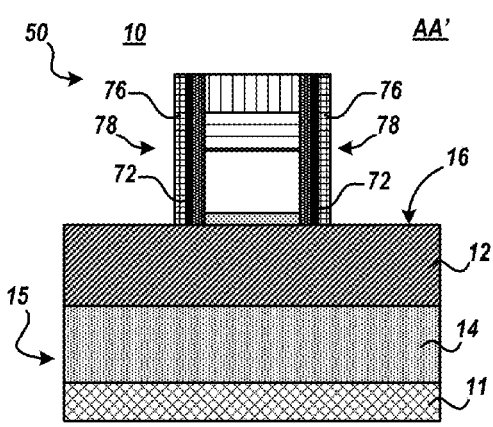

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices, and more particularly to semiconductor structures utilizing FinFETs. Such structures may include a plurality of fins 12 formed in or upon a wafer and a gate 20 covering a portion of the fins 12. The portion of the fins 12 covered by the gate 20 may serve as the channel the FinFET. Portions of the fins 12 may also extend out from under the gate 20 and may serve as source and drain regions of the structure. Semiconductor structures including FinFETs may be implemented with gate first or gate last FinFET fabrication process techniques. In gate first processes, metal layers over first structure areas (e.g. NMOS areas, etc.) and second structure areas (e.g. PMOS areas, etc.) are formed and patterned to form gate structures followed by typical CMOS processing such as forming of the source and drain, forming spacers, depositing an interlevel dielectric, etc. In a gate last process, a dummy gate structure is formed followed by typical CMOS processing including formation of the source and drain, formation of spacers, deposition of the interlevel dielectric, etc. Thereafter, the dummy gate structure is removed followed by deposition of a replacement gate structure.

Referring to the figures, wherein like components are labeled with like numerals, exemplary fabrication steps of forming a semiconductor structure 10 in accordance with embodiments of the present invention are shown, and will now be described in greater detail below. It should be noted that FIGS. 2-10 depict a cross section views of structure 10 along fin 12 center plane AA' as shown in FIG. 1. Furthermore, it should be noted that while this description may refer to some components of the structure 10 in the singular tense, more than one component may be depicted throughout the figures. The specific number of components depicted in the figures and the cross section orientation was chosen to best illustrate the various embodiments described herein.

FIG. 1 depicts an isometric view of a semiconductor structure at intermediate stages of semiconductor device fabrication, in accordance with various embodiments of the present invention. At this stage of fabrication, structure 10 includes fins 12 formed, patterned, etc. upon or within a semiconductor substrate 15. Further at this stage of fabrication, structure 10 includes gates 20 formed upon substrate 15 and a gate cap 30 formed upon gates 20.

Substrate 15 may be, for example, a layered substrate or a bulk substrate. Layered substrate may be as Si/SiGe, a silicon-on-insulator (SOI), or a SiGe-on-insulator (SGOI). Bulk semiconductor substrate materials may include undoped Si, n-doped Si, p-doped Si, single crystal Si, polycrystalline Si, amorphous Si, Ge, SiGe, SiC, SiGeC, GaAs, InAs, InP, etc. The plurality of fins 12 may be etched from the bulk substrate.

When layered substrate is utilized, it may include a base substrate 11, a buried dielectric layer 14 formed on top of the base substrate, and a SOI layer formed on top of the buried dielectric layer 14. The buried dielectric layer 14 may isolate the SOI layer from the base substrate. The plurality of fins 12 may be etched from the SOI layer. The base substrate 11 may be made from any of several known semiconductor materials such as, for example, silicon, germanium, silicon-germanium alloy, silicon carbide, silicon-germanium carbide alloy, or other similar semiconductor materials. Non-limiting examples of compound semiconductor materials include gallium arsenide, indium arsenide, and indium phosphide. Typically the base substrate 11 may be about, but is not limited to, several hundred microns thick. For example, the base substrate may have a thickness ranging from 0.5 mm to about 1.5 mm.

The buried dielectric layer 14 may include any of several dielectric materials, for example, oxides, nitrides and oxynitrides of silicon. The buried dielectric layer 14 may also include oxides, nitrides and oxynitrides of elements other than silicon. In addition, the buried dielectric layer may include crystalline or non-crystalline dielectric material. Moreover, the buried dielectric layer 14 may be formed using any of several known methods, for example, thermal or plasma oxidation or nitridation methods, chemical vapor deposition methods, and physical vapor deposition methods. The buried dielectric layer 14 may have a thickness ranging from about 5 nm to about 200 nm, though less and greater thicknesses have been contemplated. In one embodiment, the buried dielectric layer may have a thickness ranging from about 150 nm to about 180 nm.

The SOI layer may include any of the several semiconductor materials included in the base substrate 11. In general, the base substrate 11 and the SOI layer may include either identical or different semiconducting materials with respect to chemical composition, dopant concentration and crystallographic orientation. The base substrate 11 and the SOI layer may include semiconducting materials that have at least different crystallographic orientations. Typically, the SOI layer may include a thickness ranging from about 5 nm to about 100 nm, though less and greater thicknesses have been contemplated. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins 12 may be etched from the SOI layer. Because the plurality of fins 12 may be etched from the SOI layer, they too may include any of the characteristics listed above for the SOI layer.

Generally, fins 12 may be formed, patterned, etc. upon a semiconductor structure 10 by other known processes or techniques without deviating from the spirit of those embodiments herein claimed.

Gates 20 may be formed upon substrate 15 by forming gate oxide layer 40 upon an upper surface of substrate 15 and fin 12 sidewalls 13 and upper surface 16, etc. The gate oxide layer 40 may include, for example, a silicon oxide or a silicon oxynitride. In one embodiment, the gate oxide layer 40 can be formed by the deposition of silicon oxide, silicon nitride, or silicon oxynitride by CVD, atomic layer deposition (ALD), etc. The gate oxide layer 40 may have a thickness ranging from about 1 nm to about 10 nm, although a thickness less than 1 nm and greater than 10 nm have been contemplated. In one embodiment, the gate oxide layer 40 may be about 5 nm thick. In some embodiments, the gate oxide layer 40 may be sacrificial and/or replaced in subsequent operations. Generally, gate oxide layer 40 may be formed by other known or additional techniques than those described without deviating from the spirit of those embodiments herein claimed.

Gates 20 may be further formed by forming gate material 21 upon gate oxide layer 40. In various embodiments, gate material 21 a poly or nitride layer deposited on the gate oxide layer 40. In certain embodiments, gate material 21 can also be a metal or any sacrificial material, as the gate material 21 may be associated with gate last processes and therefore etched away during a later processing step and replaced with a replacement gate structure. In particular embodiments, gate material 21 may be poly silicon deposited by e.g. plasma-enhanced chemical vapor deposition (PECVD). In certain embodiments, the oxide layer 40 may be a dielectric material that can function as an etch stop layer during subsequent removal of e.g. gate material 21. Similarly, gate material 21 may be a dielectric or conducting material that can be removed selectively with respect to the oxide layer 40 and gate spacers 60. The thickness of gate material 21 may be from 10 nm to 500 nm, although lesser and greater thicknesses have been contemplated and are employed in further embodiments. Generally, gate material 21 may be formed by other known or additional techniques than those described without deviating from the spirit of those embodiments herein claimed.

In embodiments, gate(s) 20 may be associated with an NFET device formed on a first active area of structure 10 whereas, other gate(s) 60 may be associated with a PFET device formed on a second active area of structure 10. In embodiments, the gates 20 can be formed using lithographic and etching processes. For example, the lithography step may entail applying a photoresist, exposing the photoresist to a pattern of radiation, and developing the pattern utilizing a resist developer. Following the lithography step, an etching process such as reactive-ion etching (RIE) may be employed in transferring the pattern to the gates 20. In certain embodiments, poly, nitride, metal or other cap 32 may be formed upon gates 20. In certain embodiments the cap 32 may be deposited as a masking layer and utilized as a etch mask (e.g. hard mask, etc.) associated with the formation of gates 20. In certain embodiments the cap 32 may be multilayered including a first e.g. nitride mask 32 layer formed upon the gate material 21 and a second e.g. oxide mask layer 34 formed upon the first layer 32. The cap 30 may be deposited using e.g. low-pressure chemical vapor deposition (LPCVD) to a thickness of from about 15 nm to about 70 nm. The cap layer may then be patterned in accordance with desired locations of the gate 20. Using the cap 32 as a mask, an RIE may be used to remove portions of the gate material 20 outside the gate stack footprint, defining the gates 20. Subsequent to lithographic and etching processes, a gate stack 50 may be formed that includes a retained portion of gate oxide layer 40 upon substrate 15, a retained portion of gate material 21 upon the portion of gate oxide layer 40, a retained portion of mask layer 32 upon the gate material 21 portion, and a retained portion of mask layer 34 upon the mask layer 32 portion, etc. Generally, the gates 20 may be formed by other known or additional techniques than those described without deviating from the spirit of those embodiments herein claimed.

FIG. 2 depicts a cross section view of a semiconductor structure 10 at an intermediate stage of semiconductor device fabrication, in accordance with various embodiments of the present invention. At this stage of fabrication, gate spacers 60 are formed upon structure 10.

Gate spacers 60 may be a dielectric material, such as silicon oxide, silicon nitride, silicon oxynitride, or a combination, formed on the sidewalls of the gate stacks 50. The gate spacer 60 may be formed by deposition of a nitride material (IRAD, etc.) layer and then etching to remove the nitride material except from the sidewalls of the gate stack 50. The thickness of the gate spacer 60 may be from 5 nm to 120 nm, and typically from 20 nm to 60 nm, although lesser and greater thicknesses have been contemplated are employed in further embodiments. In certain embodiments, the material of gate spacers 60 is chosen such that gate 20, gate stack 50, etc. may be removed selectively with respect to gate spacers 60. For instance, if gate material 21 is poly silicon, gate spacers may be a nitride, etc. Generally, the gate spacers 60 may be formed by other known or additional techniques than those described without deviating from the spirit of those embodiments herein claimed.

FIG. 3 depicts a cross section view of a semiconductor structure 10 at an intermediate stage of semiconductor device fabrication, in accordance with various embodiments of the present invention. At this stage of fabrication, liner layer 70 and spacer layer 74 are formed. Liner layer 70 may be formed e.g. upon fins 12, upon spacers 60, upon gate stack 50, etc. and may include any of several dielectric materials, for example, oxides, nitrides and oxynitrides of silicon. The liner layer 70 may also include oxides, nitrides and oxynitrides of elements other than silicon. In addition, the liner layer 70 may include crystalline or non-crystalline dielectric material. Moreover, the liner layer 70 may be formed using any of several known methods, for example, chemical vapor deposition methods, and physical vapor deposition methods The liner layer 70 may be from 5 nm to 120 nm, and typically from 20 nm to 60 nm, although lesser and greater thicknesses have been contemplated are employed in further embodiments. Spacer layer 74 may be formed upon liner layer 70 and may include any of several dielectric materials, for example, oxides, nitrides and oxynitrides of silicon or of elements other than silicon. Spacer layer 74 may be formed using any of several known methods, for example, chemical vapor deposition methods, and physical vapor deposition methods. Spacer layer 74 may be from 5 nm to 120 nm, and typically from 20 nm to 60 nm, although lesser and greater thicknesses have been contemplated are employed in further embodiments. In certain embodiments, the material of liner layer 70 and spacer layer 74 is chosen such that liner layer 70 and spacer layer 74 may be removed selectively with respect to fins 12, substrate 15, cap 34, spacer 60, etc. In certain embodiments, liner layer 70 and spacer layer 74 may be blanket deposits upon structure 10 at respective fabrication stages. In other embodiments, liner layer 70 and spacer layer 74 may be selectively deposited upon e.g. upper surface 16 of fin 12. Generally, liner layer 70 and spacer layer 74 may be formed, deposited, etc. upon a semiconductor structure 10 by other known processes or techniques without deviating from the spirit of those embodiments herein claimed.

FIG. 4 depicts a cross section view of a semiconductor structure 10 at an intermediate stage of semiconductor device fabrication, in accordance with various embodiments of the present invention. At this stage of fabrication, sacrificial spacers 78 are formed upon structure 10. Sacrificial spacers 78 may be formed, for example, by etching to remove portions of liner layer 70 and spacer layer 74 and retaining portions 72 of liner layer 70 and portions 76 of spacer layer 74 generally upon spacer 60 sidewalls. Liner layer 70 and spacer layer 74 may be removed using any suitable etching technique such as dry etch, wet etch, or combination of both. The etching technique may require a etch mask to be formed upon and to protect portions of semiconductor device 10 which resists etching and may be a photoresist or a more durable mask, such as silicon nitride. In certain embodiments, the etchant is chosen to provide a selective removal of portions of liner layer 70 and spacer layer 74 whilst not removing fins 12, substrate 15, gate stack 50, etc. Generally, sacrificial spacers 78 may be formed, deposited, etc. upon a semiconductor structure 10 by other known processes or techniques without deviating from the spirit of those embodiments herein claimed.

Figure 5:
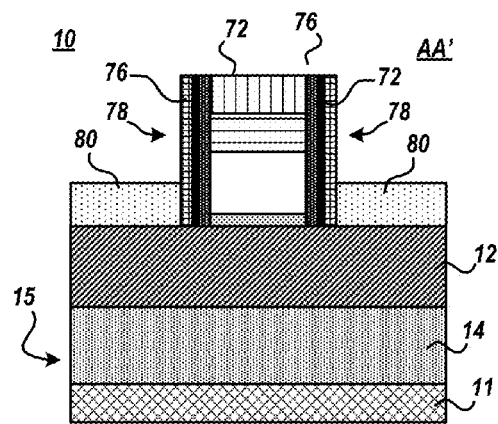

FIG. 5 depicts a cross section view of a semiconductor structure 10 at an intermediate stage of semiconductor device fabrication, in accordance with various embodiments of the present invention. At this stage of fabrication, epitaxy 80 is formed upon structure 10.

In certain embodiments, epitaxy 80 may be formed e.g. upon fin 12 sidewalls 13 so as to form the source and drain junctions, reduce contact resistance, increase stress to the channel region, and reduce the spreading resistance, etc. A non limiting list of exemplary expitaxial materials are: silicon germanium alloy (SiGe), Silicon (Si), in-situ boron doped SiGe or Si, in situ phosphorus or arsenic doped Si or SiGe, with doping levels ranging from 1e19 to 1.5e21, with 4-9e20 dopant levels preferred.

In various embodiments, fin 12 sidewalls 13 have a <110> orientation from which epitaxy 80 may be grown. When epitaxy 80 growth from neighboring fin sidewalls, <111> bound epitaxy structures may merge. For example, the tips of neighboring epitaxy 80 segments may meet and a <100> plane is formed there between allowing for further epitaxial growth from the <100> plane. Such growth may extend above fins 12 as shown in FIG. 5.

The material of the fins 12 may serve as the seed surface for the epitaxial growth of the material of epitaxy 80. The epitaxy 80 growth may be carried out in a selective manner, meaning that the epitaxial growth occurs only over certain surfaces, while other surfaces stay essentially free of the epitaxy material. Selective epitaxial growth has known techniques in the art. In certain embodiments, possible surplus epitaxial material may be removed. Such removal may take the form of various dry or wet etchings, including timed and selective etchings, or removal by polishing, etc. The epitaxial growth may be stopped once the epitaxy material growing on the sidewalls 13 merge and extend to a desired height above fins 12.

In embodiments, some material combinations may include: the fins 12 being essentially pure Si, and the epitaxy 80 material being a SiGe alloy mixture with e.g. between 20% and 60% Ge concentration. Or, the fin 12 material may essentially be pure Si or SiGe alloy mixture, and the epitaxy 80 may be Si:C with e.g. between 1% and 5% C concentration. In alternate embodiments, the fin 12 material may be a SiGe alloy mixture, typically with less than 15% Ge concentration, and the epitaxy 80 material may also be a SiGe alloy mixture, but with a differing Ge concentration than that of the fin 12 material. In alternate embodiments the fin 12 material may be a SiGe alloy mixture, typically with less than 15% Ge concentration, and the epitaxy 80 material may be Si:C with between 1% and 5% C concentration. Or, the fin 12 material may be a Si:C, and the epitaxy 80 material being a SiGe alloy mixture with between 20% and 60% Ge concentration. In further embodiments, the fin 12 material may be a SiGe alloy mixture, with between 20% and 60% Ge concentration, and the epitaxy 80 material may be essentially pure Si. In further embodiments the epitaxy 80 material may be a non-Si based semiconductor, for instance, a compound semiconductor, such as, without limiting intent, gallium arsenide.

Epitaxy 80 may be doped during the epitaxial growth, in so called in-situ doping schemes, as known in the art. Both p-type and n-type dopants are well known in the art, and any of them may be used in the embodiments of the present disclosure for doping respective fin 12 material and the epitaxy 80 material.

Figure 6:
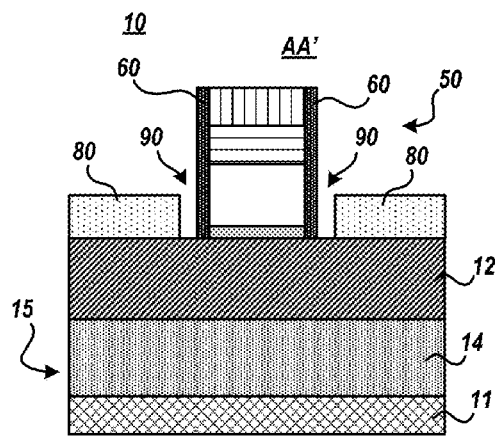

FIG. 6 depicts a cross section view of a semiconductor structure 10 at an intermediate stage of semiconductor device fabrication, in accordance with various embodiments of the present invention. At this stage of fabrication, sacrificial spacers 78 are removed from structure 10. Sacrificial spacers 78 may be removed, for example, by selectively etching sacrificial spacers 78 and retaining spacers 60, epitaxy 80, fins 12, etc. Sacrificial spacers 78 may be removed using any suitable etching technique such as dry etch, wet etch, or combination of both. The etching technique may require a etch mask to be formed upon and to protect portions of semiconductor device 10 which resists etching and may be a photoresist or a more durable mask, such as silicon nitride. In certain embodiments, sacrificial spacers 78 are removed in a multi etch processes wherein the portion 76 spacer layer 74 is removed and subsequently the portion 72 of liner layer 70 is removed. With the removal of sacrificial spacers 78, trenches 90 are formed between epitaxy 80 and spacers 60 upon fins 12. Generally, sacrificial spacers 78 may be removed, stripped, etc. from semiconductor structure 10 by other known processes or techniques without deviating from the spirit of those embodiments herein claimed.

Figure 7:
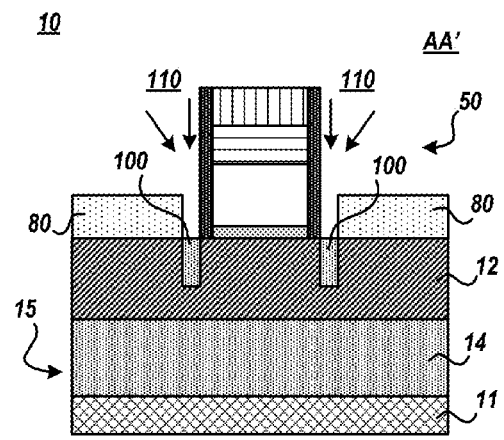

FIG. 7 depicts a cross section view of a semiconductor structure 10 at an intermediate stage of semiconductor device fabrication, in accordance with various embodiments of the present invention. At this stage of fabrication, extension regions 100 (e.g. PFET (e.g. As/P halo and B/BF2 extension, etc.) and the NFET (e.g. B halo and As/P extension, etc.) of structure 10 may be implanted with respective dopants to set the overlap capacitance, extension resistance, and/or threshold voltage. These implanted dopants may be referred to as halo and/or extension regions. The ion implantation dopants may be chosen, as is known in the art, to set the overlap capacitance, extension resistance, and/or threshold voltage. Arrows 110 denote implantation of ions within the fins 12. This results in doped extension regions 100 of the fins 12 that extend under trench 90. Undoped regions may remain within the fin 12 directly under the gate stack 50. In certain embodiments, low energy I/I, cluster I/I, or plasma doping techniques may be utilized to form extension regions 100. In various embodiments, at the present fabrication stage, and as shown in FIG. 7, extension regions 100 may not extend the entire depth of fins 12. Generally, extension regions 100 may be deposited, formed, etc. upon semiconductor structure 10 by other known processes or techniques without deviating from the spirit of those embodiments herein claimed.

Figure 8:
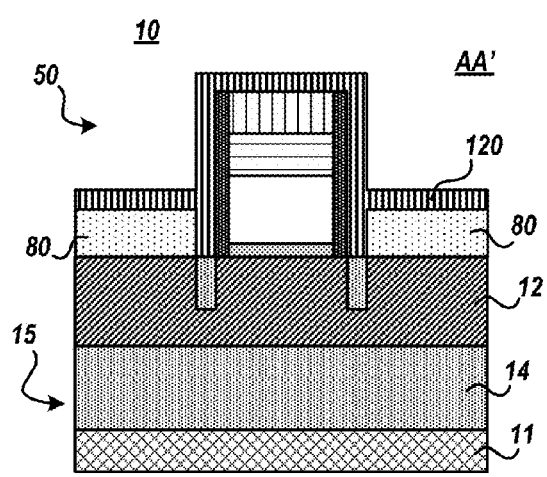

FIG. 8 depicts a cross section view of a semiconductor structure 10 at an intermediate stage of semiconductor device fabrication, in accordance with various embodiments of the present invention. At this stage of fabrication, replacement spacer layer 120 is formed. Spacer layer 120 may be formed e.g. upon extension regions 100 within trench 90, upon epitaxy 80, upon spacers 60, upon gate stack 50, etc. and may include any of several dielectric materials, for example, oxides, nitrides and oxynitrides of silicon. The spacer layer 120 may also include oxides, nitrides and oxynitrides of elements other than silicon. In addition, the spacer layer 120 may include crystalline or non-crystalline dielectric material. Moreover, the liner layer 120 may be formed using any of several known methods, for example, chemical vapor deposition methods, and physical vapor deposition methods The spacer layer 120 may be from 5 nm to 120 nm, and typically from 20 nm to 60 nm, although lesser and greater thicknesses have been contemplated are employed in further embodiments. In a particular embodiment, spacer layer 120 may be IRAD nitride. In certain embodiments, spacer layer 120 may be blanket deposit upon structure 10. In other embodiments, spacer layer 120 may be selectively deposited upon e.g. upper surface epitaxy 80 above fin 12, etc. Generally, spacer layer 120 may be formed, deposited, etc. upon a semiconductor structure 10 by other known processes or techniques without deviating from the spirit of those embodiments herein claimed.

Figure 9:
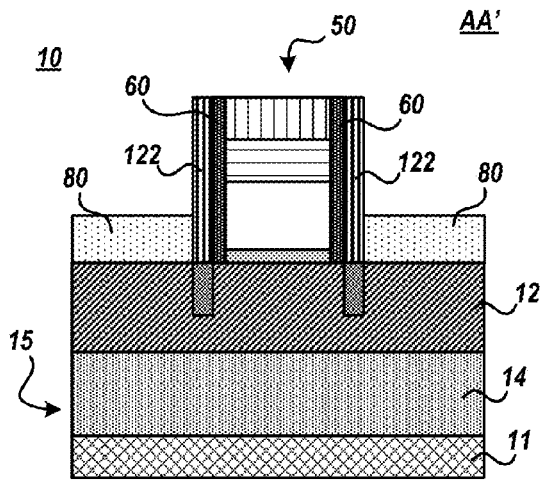

FIG. 9 depicts a cross section view of a semiconductor structure 10 at an intermediate stage of semiconductor device fabrication, in accordance with various embodiments of the present invention. At this stage of fabrication, replacement spacers 122 are formed upon structure 10. Replacement spacers 122 may be formed, for example, by etching to remove portions of spacer layer 120 and retaining portions of spacer layer 120 generally upon spacer 60 sidewalls. Spacer layer 120 may be removed using any suitable etching technique such as dry etch, wet etch, or combination of both. The etching technique may require a etch mask to be formed upon and to protect portions of semiconductor device 10 which resists etching and may be a photoresist or a more durable mask, such as silicon nitride. In certain embodiments, the etchant is chosen to provide a selective removal of portions of spacer layer 120 whilst not removing epitaxy 80, gate stack 50, etc. Generally, replacement spacers 122 may be formed, deposited, etc. upon a semiconductor structure 10 by other known processes or techniques without deviating from the spirit of those embodiments herein claimed.

Figure 10:
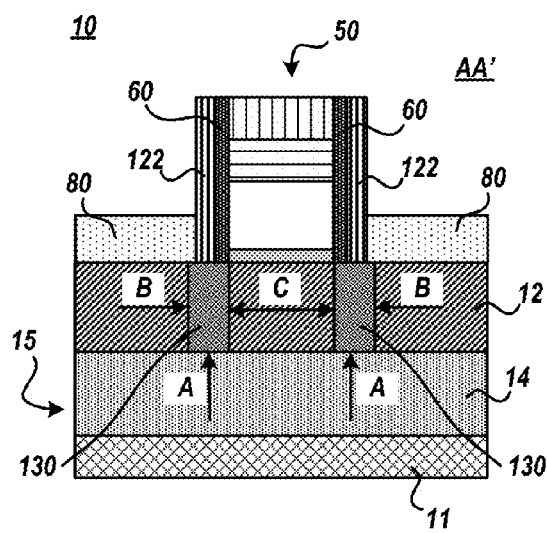

FIG. 10 depicts a cross section view of a semiconductor structure 10 at an intermediate stage of semiconductor device fabrication, in accordance with various embodiments of the present invention. At this stage of fabrication, extension regions 130 are formed upon structure 10. In certain embodiments, an annealing process may be performed to activate, diffuse, provide for an abrupt junction, and/or grow extension regions 100 to form extension regions 130. Exemplary annealing processes may be using laser anneal, spike anneal, flash anneal, long flash anneal, etc. to avoid the loss of extension region implants, activate, diffuse, center, and/or grow extension region implants. In certain embodiments, extension regions 130 are formed from undamaged crystalline templates of plane A, plane B, and/or plane C in extension region 130 annealing processes. These 3 un-damaged regions, namely; below epitaxy 80 source/drain regions (i.e. plane B), device channel (i.e. plane C), and fin 12 bottom (i.e. plane A) may provide crystalline templates for e.g. I/I re-growth for forming defect-free extension region 130 doping. Such embodiments may provide for the ability to separately optimize extension region 130 junction abruptness and low source drain silicide contact resistance for improved FinFET device performance.

In certain embodiments, the semiconductor or conductor material to one side of extension region 130 pair forms the source of the FinFET, the semiconductor or conductor material between extension region 130 pair forms the channel of the FinFET, and the material to the other side of the extension region 130 pair forms the drain region of the FinFET. Doped or undoped material may remain within the fin 12 directly under the gate stack 50. In certain embodiments, the outer sidewalls of extension regions 130 may be coplanar with the outer sidewalls of replacement spacers 122. In other embodiments, the outer sidewalls of extension regions 130 may extend beyond the outer sidewalls of replacement spacers 122. In certain embodiments, the inner sidewalls of extension regions 130 may be coplanar with the outer sidewalls of gate stack 50. In certain embodiments, the inner sidewalls of extension regions 130 may extend beyond the outer sidewalls of gate stack 50. Still in certain embodiments, the upper surface of extension region 130 is coplanar with the upper surface 16 of fin 12 and the lower surface of extension region 130 is coplanar with the lower surface of fin 12/upper surface of substrate 15.

Though shown as a last stage of fabrication, structure 10 may undergo further fabrication steps that may add or remove materials, etc. in further front end of line, middle end of line, or back end of line fabrication steps to form a semiconductor device. For example, if structure 10 is undergoing gate last fabrication processes, structure 10 may undergo further fabrication stages to form replacement gates. The replacement gates may be formed over/covering at least a portion of each of the fins in the channel region. The replacement gates may be formed by removing gate stack 50 and filling a resulting trench with a gate material (so as to cover the fins 12). The replacement gates may be formed as, for example, P-type gate stack(s) or N-type gate stack(s), etc.

Figure 11:
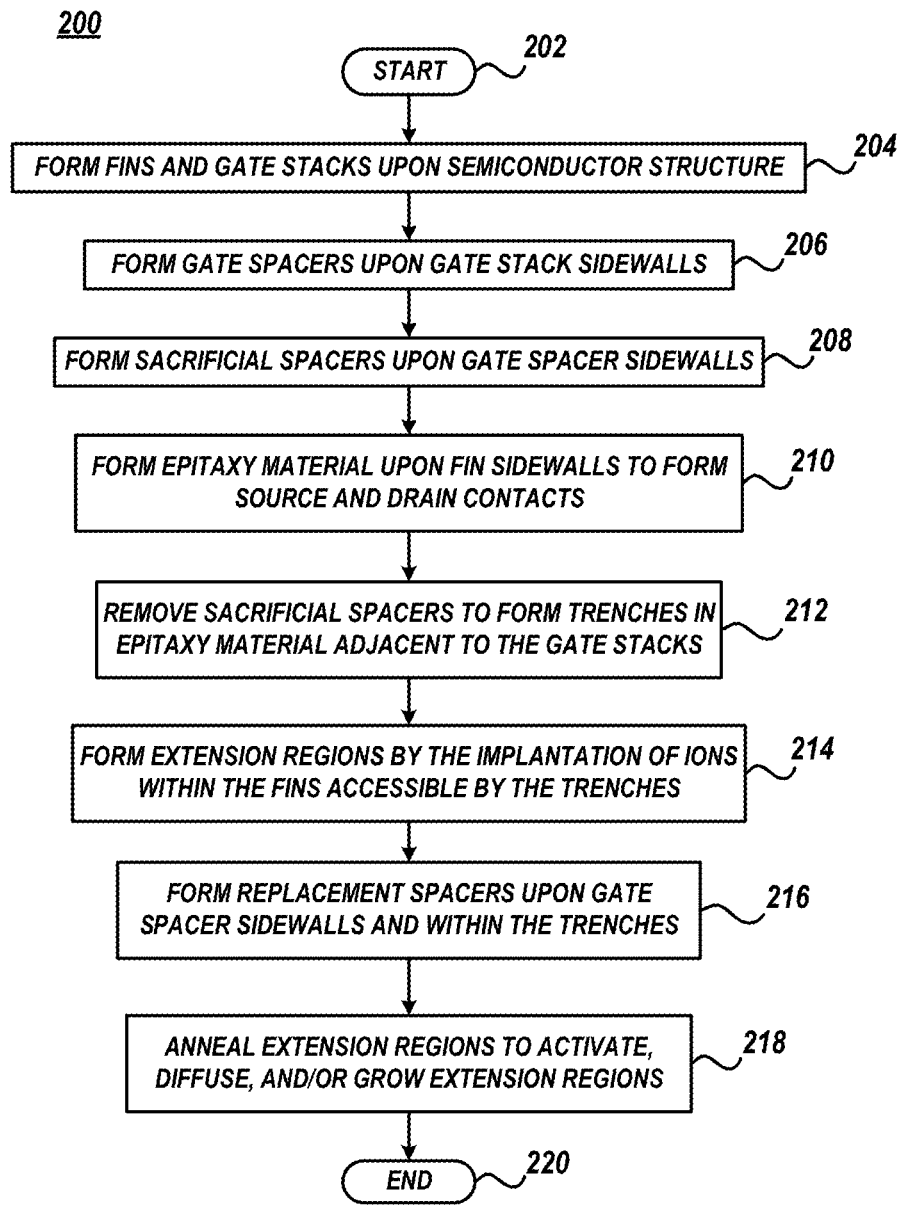
FIG. 11 depicts an exemplary fabrication process flow method, in accordance with various embodiments of the present invention.

FIG. 11 depicts an exemplary process flow method 200 for manufacturing a semiconductor device, in accordance with various embodiments of the present invention. Method 200 begins at block 202 and continues by forming fins 12 and gate stacks 50 upon semiconductor structure 10 (block 204). For example, fins 12 may be formed upon a layered substrate or a bulk substrate of semiconductor structure 10. An exemplary depiction of semiconductor structure 10 subsequent to block 204 processes or techniques is shown in FIG. 1.

Method 200 may continue with forming gate spacers 60 generally upon gate stack 50 sidewalls (block 206). The gate spacer 60 may be formed by deposition of e.g. IRAD nitride and etching to remove the nitride material except from the sidewalls of the gate stack 50. An exemplary depiction of semiconductor structure 10 subsequent to block 206 processes or techniques is shown in FIG. 2.

Method 200 may continue with forming sacrificial spacers 78 upon gate spacer 60 sidewalls (block 208). Sacrificial spacers 78 may be formed by depositing a liner layer 70 and a spacer layer 74 upon structure 10, removing portions of liner layer 70 and spacer layer 74, and retaining portions 72 of liner layer 70 and portions 76 of spacer layer 74 generally upon spacer 60 sidewalls. An exemplary depiction of semiconductor structure 10 subsequent to block 208 processes or techniques is shown in FIG. 4.

Method 200 may continue with forming epitaxy 80 upon fin 12 sidewalls 13 merging epitaxy 80 over the fins 12 to form source and drain contacts (block 210). For example, epitaxy 80 growth from neighboring fin sidewalls, <111> bound epitaxy structures may merge and a <100> plane is formed there between allowing for further vertical epitaxial growth from the <100> plane. Such vertical growth may extend over fins 12. The epitaxial growth may be stopped once the epitaxy material growing on the sidewalls 13 merge and extend to a desired height above fins 12. An exemplary depiction of semiconductor structure 10 subsequent to block 210 processes or techniques is shown in FIG. 5.

Method 200 may continue with forming trenches 90 within epitaxy 80 adjacent to spacers 60 exposing the upper surface 16 of fins 12 (block 212). In embodiments, exposing the upper surface 16 of fins 12 includes opening the fin 12 top surface 16 and sidewall surface 13. Trenches 90 may be formed by removing sacrificial spacers 78 from structure 10. For example, sacrificial spacers 78 may be removed, by selectively etching sacrificial spacers 78 and retaining spacers 60, epitaxy 80, fins 12, etc. An exemplary depiction of semiconductor structure 10 subsequent to block 212 processes or techniques is shown in FIG. 6.

Method 200 may continue with forming extension regions 100 by the implantation of ions, dopants, etc. within the fins 12 assessable by trenches 90 (block 214). For example, PFET regions (e.g. As/P halo and B/BF2 extension, etc.) and NFET regions (e.g. B halo and As/P extension, etc.) of structure 10 may be implanted with respective dopants to set the overlap capacitance, extension resistance, and/or threshold voltage. An exemplary depiction of semiconductor structure 10 subsequent to block 214 processes or techniques is shown in FIG. 7.

Method 200 may continue with forming replacement spacers 122 upon gate spacer 60 sidewalls and within trenches 90 (block 216). Replacement spacers 122 may be formed by depositing a replacement spacer layer 120 e.g. upon extension regions 100 within trench 90, upon epitaxy 80, upon spacers 60, upon gate stack 50, etc. The replacement spacers 122 may be formed, by remove portions of spacer layer 120 and retaining portions of spacer layer 120 generally upon spacer 60 sidewalls and within trenches 90. Spacer layer 120 may be removed using any suitable etching technique such as dry etch, wet etch, or combination of both. An exemplary depiction of semiconductor structure 10 subsequent to block 216 processes or techniques is shown in FIG. 9.

Method 200 may continue with forming extension regions 130 by annealing structure 10 (block 218). The anneal may be performed to activate, diffuse, and/or grow extension regions 100 to form extension regions 130. Exemplary annealing processes may be using laser anneal, spike anneal, flash anneal, long flash anneal, etc. to avoid the loss of extension region implants, activate, diffuse, center, and/or grow extension region implants. An exemplary depiction of semiconductor structure 10 subsequent to block 218 processes or techniques is shown in FIG. 10. Method 200 ends at block 220.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

Unless described otherwise or in addition to that described herein, "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly" or "poly silicon" should be understood to refer to polycrystalline silicon.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device fabrication process comprising:
   forming a plurality of fins upon a semiconductor substrate;
   forming a plurality of gates upon the semiconductor substrate and upon and orthogonal to the plurality of fins;
   forming a plurality of source drain contacts by growing epitaxy material over the fins;
   forming a trench between the epitaxially formed material and a gate to expose an upper surface of a fin region;
   doping the fin region to form an extension region, and;
   activating the extension region by annealing.

2. The semiconductor device fabrication process of claim 1, further comprising:
   forming gate spacers upon sidewalls of the plurality of gates.

3. The semiconductor device fabrication process of claim 2, further comprising:
   forming sacrificial spacers upon sidewalls of the gate spacers.

4. The semiconductor device fabrication process of claim 3, wherein forming sacrificial spacers further comprises:
   depositing a liner layer upon the sidewalls of the gate spacers, and;
   depositing a spacer layer upon the liner layer.

5. The semiconductor device fabrication process of claim 3, wherein forming the trench further comprises:
   removing the sacrificial spacers upon the sidewalls of the gate spacers subsequent to the growing of epitaxy material.

6. The semiconductor device fabrication process of claim 1, wherein a lower surface of the extension region is above a lower surface of the plurality of fins prior to the annealing.

7. The semiconductor device fabrication process of claim 1, wherein a lower surface of the extension region is coplanar with a lower surface of the plurality of fins subsequent to the annealing.

8. The semiconductor device fabrication process of claim 1, wherein forming the plurality of gates upon the semiconductor substrate, further comprises:
   forming a gate oxide layer upon the substrate and upon the plurality of fins;
   forming gate material upon the gate oxide layer;
   forming a gate cap upon the gate material, and;
   removing portions of the gate oxide layer, gate material, and gate cap and retaining portions of the gate oxide layer, gate material, and gate cap to form the plurality of gates.

9. The semiconductor device fabrication process of claim 1, wherein the semiconductor substrate is a multilayered semiconductor substrate.

10. A semiconductor device fabrication process comprising:
    forming a fin upon a semiconductor substrate;
    forming a gate stack upon a semiconductor substrate and upon and orthogonal to the fin;
    forming a gate spacer upon sidewalls of the gate stack;
    forming a sacrificial spacer upon the gate spacer by depositing a liner layer and a spacer layer, removing portions of the liner layer and spacer layer, and retaining portions of the liner layer and portions of the spacer layer generally upon sidewalls of the gate spacer;
    forming epitaxially grown material upon sidewalls of the fin;
    forming a trench between the epitaxially grown material and the gate spacer to expose an upper surface of the fin by removing the sacrificial spacer;
    forming extension regions by implanting ions within a fin region assessable by the trench, and;
    forming replacement spacers upon sidewalls of the gate spacer and within the trench.

11. The semiconductor device fabrication process of claim 10, further comprising:
    annealing the extension regions.

* * * * *